US011414026B2

(12) United States Patent
Hsiao

(10) Patent No.: US 11,414,026 B2
(45) Date of Patent: Aug. 16, 2022

(54) FIXING FRAME FOR SUPPORTING IN-VEHICLE COMPUTER

(71) Applicants: Inventec (Pudong) Technology Corp., Shanghai (CN); Inventec Corporation, Taipei (TW)

(72) Inventor: Chi-Cheng Hsiao, Taipei (TW)

(73) Assignees: Inventec (Pudong) Technology Corp., Shanghai (CN); Inventec Corporation, Taipei (TW)

(*) Notice: Subject to any disclaimer, the term of this patent is extended or adjusted under 35 U.S.C. 154(b) by 81 days.

(21) Appl. No.: 17/020,775

(22) Filed: Sep. 14, 2020

(65) Prior Publication Data

US 2021/0380045 A1    Dec. 9, 2021

(30) Foreign Application Priority Data

Jun. 9, 2020 (CN) .......................... 202010519253.5

(51) Int. Cl.
| | |
|---|---|
| *B60R 11/02* | (2006.01) |
| *H05K 5/02* | (2006.01) |
| *B60R 11/00* | (2006.01) |
| *B60R 16/023* | (2006.01) |
| *H05K 5/00* | (2006.01) |

(52) U.S. Cl.
CPC ....... *B60R 11/0264* (2013.01); *B60R 16/0239* (2013.01); *B60R 2011/0052* (2013.01); *B60R 2011/0066* (2013.01); *H05K 5/0008* (2013.01); *H05K 5/0204* (2013.01)

(58) Field of Classification Search
CPC ......... B60R 11/0264; B60R 2011/0052; B60R 2011/0066; B60R 16/0239; H05K 5/0008; H05K 5/0204
See application file for complete search history.

(56) References Cited

U.S. PATENT DOCUMENTS

| 11,230,234 B1* | 1/2022 | Sharma | ................ H04N 5/2252 |
| 2015/0264823 A1* | 9/2015 | Shirley | .................. F16M 13/02 |
| | | | 248/287.1 |

FOREIGN PATENT DOCUMENTS

| CN | 109515336 A | * | 3/2019 | ............. B60R 11/00 |
| KR | 20140131064 A | * | 11/2014 | ........... G06F 1/1601 |

* cited by examiner

*Primary Examiner* — Douglas M Wilson
(74) *Attorney, Agent, or Firm* — Winston Hsu

(57) ABSTRACT

A fixing frame is used for supporting an in-vehicle computer and includes a horizontal portion, a vertical portion, a side wall portion, and a connecting portion. The vertical portion is perpendicularly connected to the horizontal portion. The side wall portion is perpendicularly connected to the horizontal portion and the vertical portion. The connecting portion is connected to the horizontal portion opposite to the vertical portion and has a free end. The free end is located above the vertical portion. Therein, the fixing frame supports the in-vehicle computer through the vertical portion and the free end which are fixedly connected to a casing of the in-vehicle computer.

9 Claims, 5 Drawing Sheets

# FIXING FRAME FOR SUPPORTING IN-VEHICLE COMPUTER

BACKGROUND OF THE INVENTION

1. Field of the Invention

The present invention relates to an in-vehicle computer, and more particularly to a fixing frame for supporting an in-vehicle computer.

2. Description of the Prior Art

With the increase in the breadth and depth of vehicle control, the electronic control system of a vehicle also increases its system complexity and device volume. At the same time, the demand for the stability of system operation also increases. At present, the in-vehicle computer is usually simply fixed on a vehicle frame thereof and is often limited by the vehicle's structure configuration (e.g. the structure of the vehicle frame, the arrangement of other components, and so on), which make it difficult to firmly fix the in-vehicle computer in the vehicle. Furthermore, after the vehicle is started, it will often vibrate along with the operation of an engine of the vehicle, or vibration will be generated when the vehicle is running on the road. No matter what kind of vibration, it will have a negative impact on the operation of the in-vehicle computer itself or its fixing structure. In other words, the current method of fixing the in-vehicle computer cannot directly solve the above-mentioned problems, or still cannot effectively solve the above-mentioned problems.

SUMMARY OF THE INVENTION

An objective of the invention is to provide a fixing frame, used for supporting an in-vehicle computer. The structural components of the fixing frame can produce structural constraints in both horizontal and vertical directions, so that the fixing frame can form a rigid frame by itself. Furthermore, the fixing frame also uses a free end structure to be joined with a casing of the in-vehicle computer, thereby forming a rigid structure together.

A fixing frame according to the invention is used for supporting an in-vehicle computer. The fixing frame includes a horizontal portion, a vertical portion, a side wall portion, and a connecting portion. The vertical portion and the horizontal portion are perpendicularly connected with each other. The side wall portion is perpendicularly connected with the horizontal portion and the vertical portion. The connecting portion is connected to the horizontal portion opposite to the vertical portion. The connecting portion includes a free end. The free end is located above the vertical portion. Therein, the fixing frame is fixedly connected to a casing of the in-vehicle computer through the vertical portion and the first free end for supporting the in-vehicle computer. Thereby, the fixing frame can form a rigid frame by itself through the structural relationship of the interconnection of the horizontal portion, the vertical portion, and the side wall portion, which is conducive to firmly supporting the in-vehicle computer. At the same time, the free end, the horizontal portion, and the portion of the fixing frame which is connected to the casing form a rigid structure together, which is also conducive to firmly supporting the in-vehicle computer. Therefore, the fixing frame according to the invention can solve the problem in the prior art that the fixing structure is not easy to firmly fix the in-vehicle computer and the vibration will affect the fixing structure after the vehicle is started or when driving on the road.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
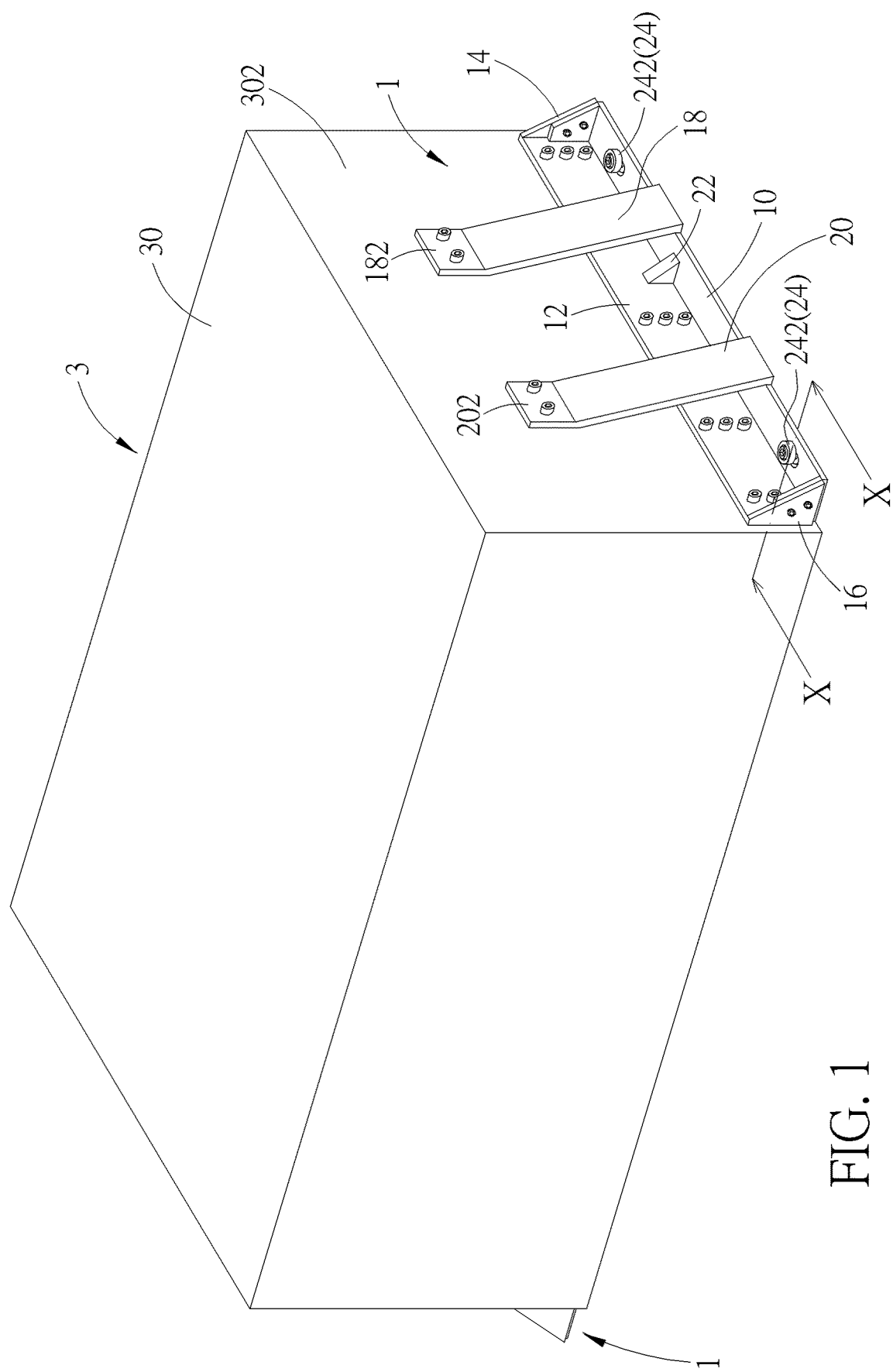
FIG. 1 is a schematic diagram illustrating a fixing frame supporting an in-vehicle computer according to an embodiment.
Figure 2:
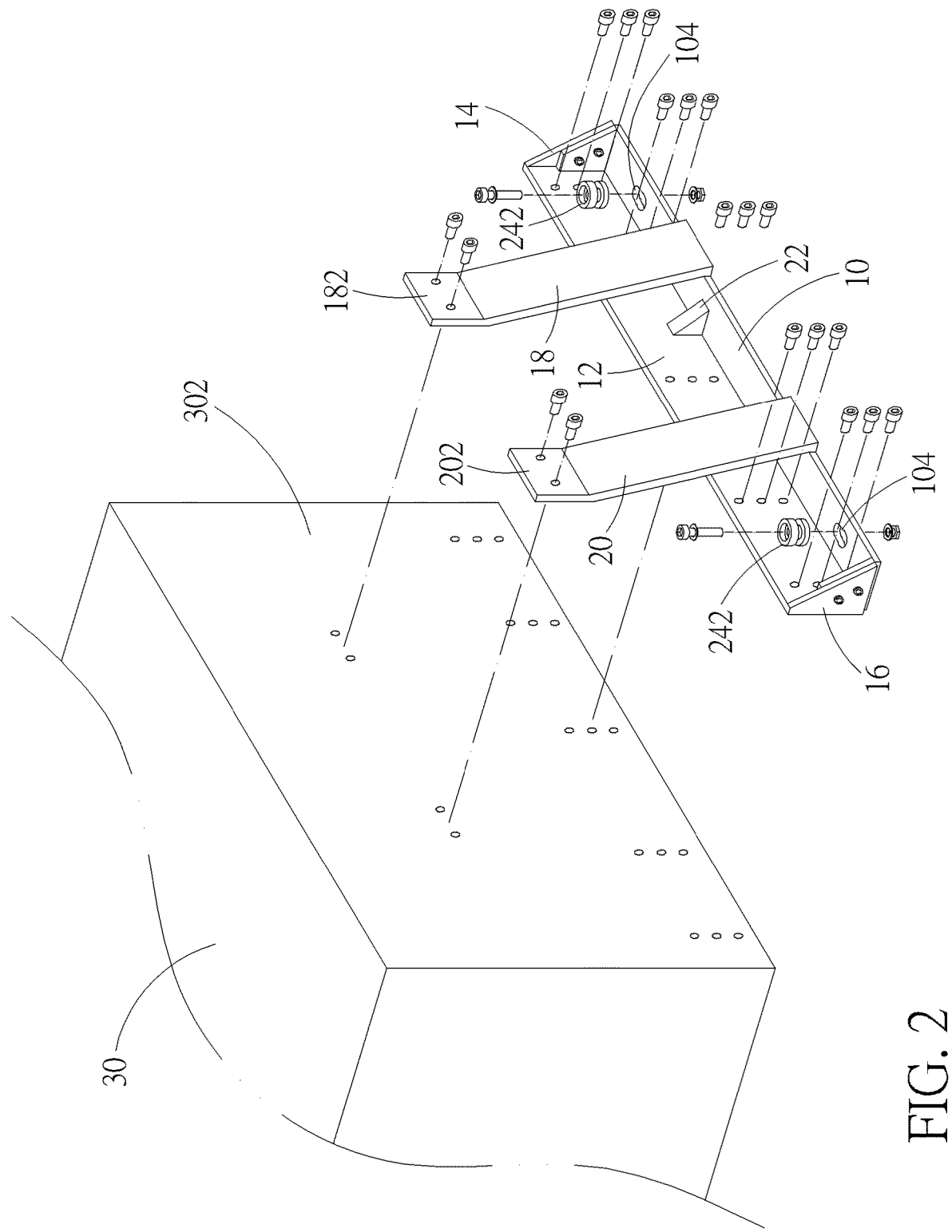
FIG. 2 is an exploded view of the fixing frame and the in-vehicle computer in FIG. 1.
Figure 3:
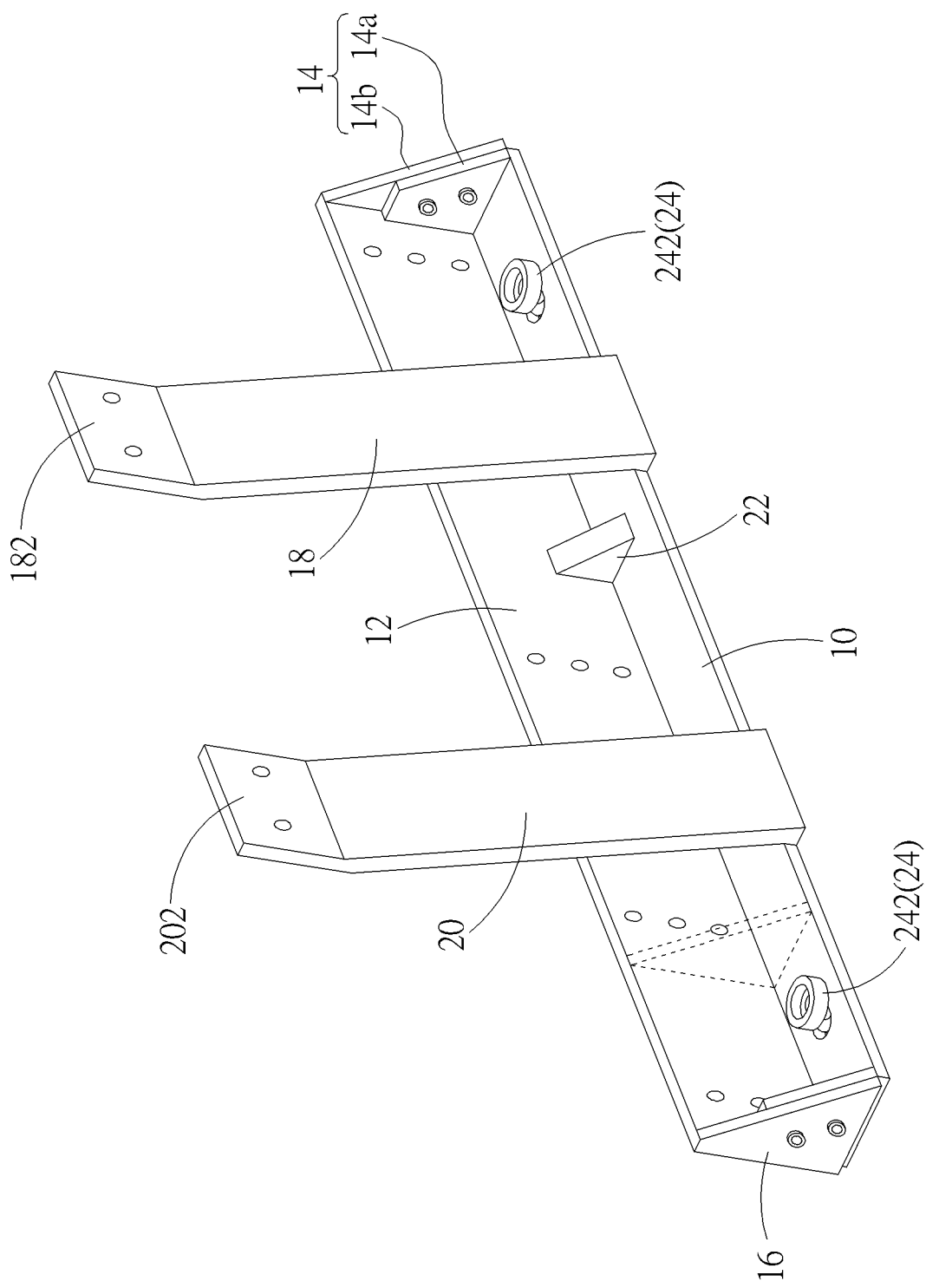
FIG. 3 is a schematic diagram illustrating the fixing frame in FIG. 1.

Please refer to FIG. 1 to FIG. 4. A fixing frame 1 according to an embodiment is used for supporting an in-vehicle computer 3; therein, for drawing simplification, the in-vehicle computer 3 is shown as a block in the figures. The fixing frame 1 includes a horizontal portion 10, a vertical portion 12, a first side wall portion 14, and a second side wall portion 16. The vertical portion 12 and the horizontal portion 10 are perpendicularly connected with each other. Both the first side wall portion 14 and the second side wall portion 16 are perpendicularly connected with the horizontal portion 10 and the vertical portion 12; the structural configuration makes the fixing frame 1 itself a triangular structure, which can enhance the structural strength of the fixing frame 1. In the embodiment, the fixing frame 1 as a whole substantially shows a long strip. The first side wall portion 14 and the second side wall portion 16 are respectively located at two end portions of each of the horizontal portion 10 and the vertical portion 12; in other words, the first side wall portion 14 and the second side wall portion 16 are located at two sides of the fixing frame 1 in the length direction of the fixing frame 1. However, it is not limited thereto in practice. For example, the first side wall portion 14 and the second side wall portion 16 are not located at the end portions of the horizontal portion 10 and the vertical portion 12, but are located toward the center of the fixing frame 1 (as shown by dashed lines in FIG. 3); the structural configuration still can enhance the structural strength.

Furthermore, in the embodiment, the fixing frame 1 also includes a first connecting portion 18 and a second connecting portion 20. The first connecting portion 18 and the second connecting portion 20 are connected to the horizontal portion 10 opposite to the vertical portion 12 and are located between the first side wall portion 14 and the second side wall portion 16. The first connecting portion 18 has a first free end 182. The second connecting portion 20 has a second free end 202. The first free end 182 and the second free end 202 are located above the vertical portion 12.

The fixing frame 1 is fixedly connected to a side wall 302 of a casing 30 of the in-vehicle computer 3 through the vertical portion 12, the first free end 182, and the second free end 202 (e.g. but not limited to screw locking), so as to support the in-vehicle computer 3. Therein, the vertical portion 12 together with the side wall 302, the first connecting portion 18 (or the second connecting portion 20), and the horizontal portion 10 forma triangular structure, which also can enhance the structural strength. In the embodiment, the vertical portion 12 is fixedly connected to a bottom portion (or a lower fringe) of the side wall 302. The first free end 182 and the second free end 202 are fixedly connected to a position of one-half to two-thirds of a height of the side wall 302; in other words, a height H1 of the first free end 182 connected to the side wall 302 is one-half to two-thirds of a height H0 of the casing 30. Thereby, the vertical portion 12 does not need to be joined with the side wall 302 in a large area. The fixing frame 1 still can increase the degree of integration with the side wall 302 through the first connecting portion 18 and a second connecting portion 20, which can increase the supporting strength and stability of the fixing frame 1 to the in-vehicle computer 3 (or the casing 30 thereof).

In addition, in practice, the connection location of the side wall 302 and the vertical portion 12 can be determined by design (e.g. in coordination with the space configuration in the vehicle) and is not limited to the bottom portion of the side wall 302 in the embodiment. Similarly, the connection locations of the side wall 302 with the first free end 182 and the second free end 202 also can be determined by design and is not limited to the embodiment. For example, in accordance with the disposition of the in-vehicle computer 3 in the vehicle, appropriate positions of the side wall 302 for connecting with the first free end 182 and the second free end 202 can be determined, which also can enhance the strength of the supporting structure.

Figure 5:
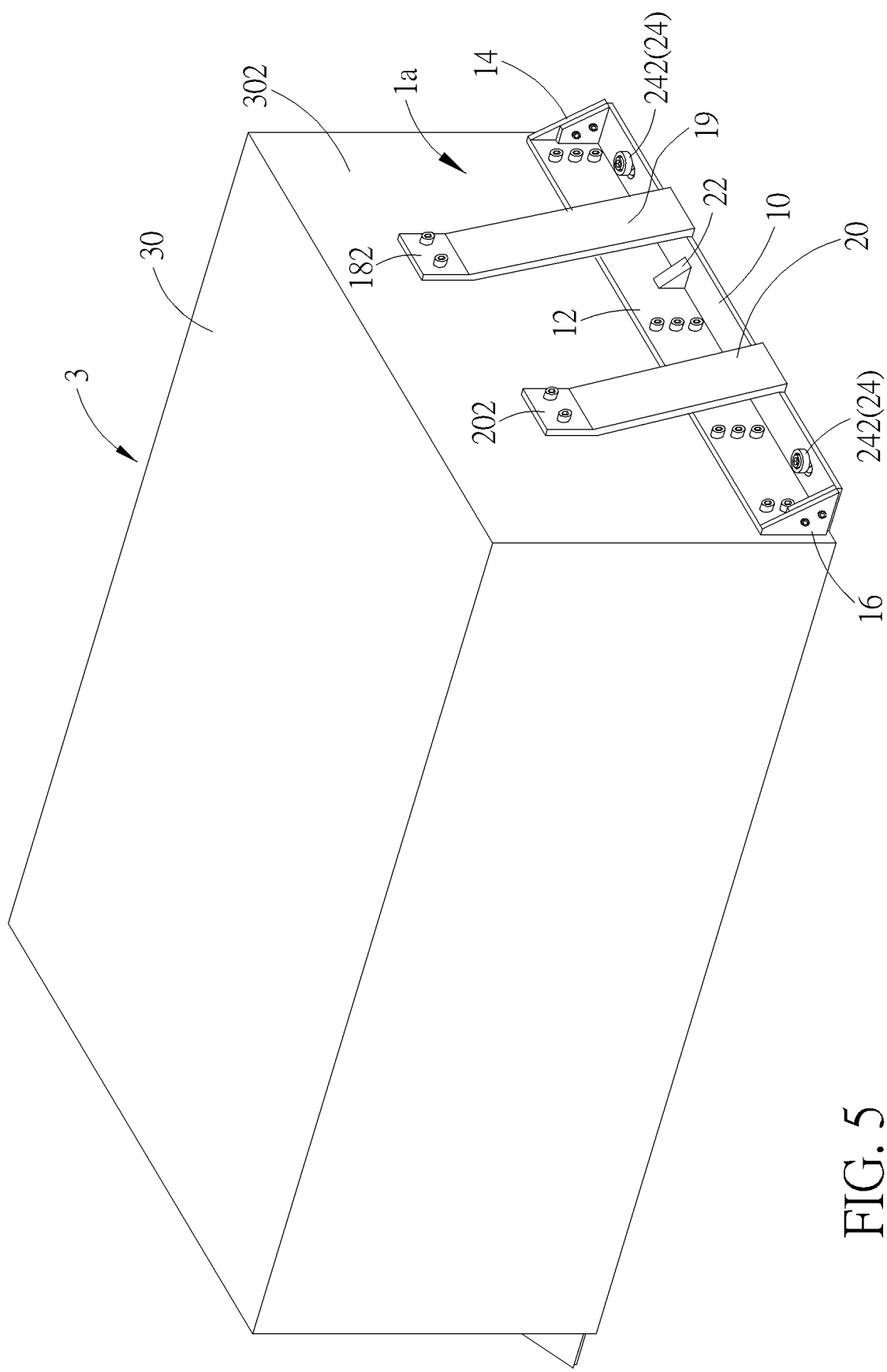
FIG. 5 is a schematic diagram illustrating a fixing frame supporting an in-vehicle computer according to another embodiment.

In practice, the locations of the first free end 182 and the second free end 202 above the vertical portion 12 are selectable and can be different (e.g. at different vertical heights), so that the first free end 182 and the second free end 202 can be respectively connected to the side wall 302 at different vertical heights. For example, a fixing frame 1a shown by FIG. 5 is structurally similar to the fixing frame 1 and uses the reference numbers of the fixing frame 1. Relevant descriptions of the fixing frame 1a will not be described in addition. Compared with the fixing frame 1, a first connecting portion 19 of the fixing frame 1a is longer in length, so the position of the first free end 182 fixed to the side wall 302 is higher than that of the second free end 202. The structural design helps the in-vehicle computer 3 to adapt to the actual installation environment in the vehicle (e.g. for avoiding structural interference with other structures or devices in the vehicle).

Please refer back to FIG. 1 to FIG. 4. In the embodiment, the fixing frame 1 is formed by a single metal plate, e.g. by a stamping process or the like. Therein, the first side wall portion 14 includes two overlapping plate portions 14a and 14b which bend and extend from the horizontal portion 10 and the vertical portion 12 respectively. In practice, the plate portions 14a and 14b can be joined together by screwing, riveting, welding, and so on. The same is true for the second side wall portion 16, which will not be repeated in addition.

Furthermore, in the embodiment, the fixing frame 1 includes a plurality of reinforcement rib structures 22 disposed where the horizontal portion 10 and the vertical portion 12 are connected, for enhancing the structural strength of the fixing frame 1. The reinforcement rib structures 22 can be formed together with a metal plate stamping process or the like. In practice, the reinforcement rib structure 22 can also be realized by joining additional part to the horizontal portion 10 and the vertical portion 12 (e.g. but not limited to welding triangular plates to the horizontal portion 10 and the vertical portion 12). In this case, the size of the reinforcement rib structure 22 can be easily designed, which can enhance the structural strength of fixing frame 1 more effectively.

Figure 4:
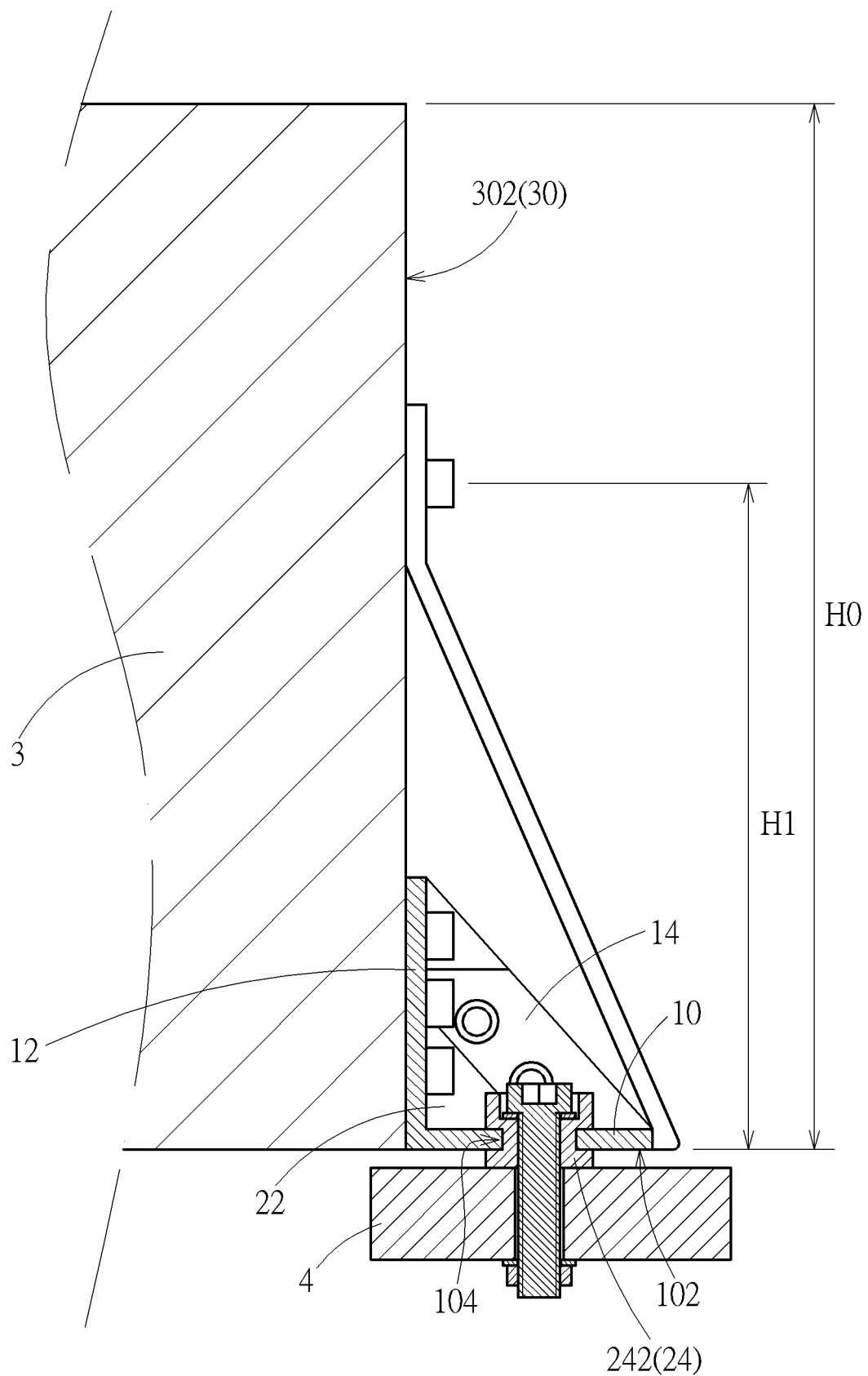
FIG. 4 is a sectional view of the fixing frame supporting the in-vehicle computer along the line X-X in FIG. 1.

As shown by FIG. 1, in practice, the in-vehicle computer 3 is usually installed in the vehicle through two fixing frames 1 (usually connected to two opposite sides of the casing 30), e.g. but not limited to onto a supporting bracket 4 (shown as a solid structure in FIG. 4). In the embodiment, the fixing frame 1 also includes a buffer structure 24 disposed on a bottom surface 102 of the horizontal portion 10, so that the fixing frame 1 is disposed on the supporting bracket 4 through the buffer structure 24. In the embodiment, the horizontal portion 10 has a plurality of fixing holes 104. The buffer structure 24 includes, e.g. but not limited to, a plurality of rubber rings 242 fitting in the fixing holes 104 respectively. The horizontal portion 10 is fixed to the supporting bracket 4 by a plurality of bolts passing through the fixing holes 104 and corresponding nuts screwed on the bolts. Thereby, the buffer structure 24 can reduce or eliminate the vibration of the vehicle which is transferred to the fixing frame 1 through the supporting bracket 4 and then to the in-vehicle computer 3, which can prevent the vibration from affecting the structure and operation of the in-vehicle computer 3.

In addition, in the embodiment, the horizontal portion 10, the vertical portion 12, and the first side wall portion 14 (or the second side wall portion 16) are perpendicular to each other; however, it is not limited thereto. In practice, the angle formed by connecting the horizontal portion 10 and the vertical portion 12 can be designed according to actual requirements, e.g. in coordination with the inclination angle of the side wall 302 of the casing 30, the angle of a supporting platform provided by the supporting bracket 4, and so on.

In an embodiment according to the invention, the technology of the present invention can be applied to in-vehicle devices, such as self-driving cars, electric cars, semi-autonomous cars, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing frame, used for supporting an in-vehicle computer, the fixing frame comprising:
    a horizontal portion;
    a vertical portion, connected with the horizontal portion;
    a first side wall portion, perpendicularly connected with the horizontal portion and the vertical portion, the first side wall portion comprising two overlapping plate portions which bend and extend from the horizontal portion and the vertical portion respectively; and
    a first connecting portion, connected to the horizontal portion opposite to the vertical portion, the first connecting portion comprising a first free end, the first free end being located above the vertical portion;
    wherein the fixing frame is fixedly connected to a casing of the in-vehicle computer through the vertical portion and the first free end for supporting the in-vehicle computer.

2. The fixing frame according to claim 1, wherein the vertical portion is perpendicularly connected with the horizontal portion.

3. The fixing frame according to claim 1, further comprising a second side wall portion, perpendicularly connected with the horizontal portion and the vertical portion.

4. The fixing frame according to claim 3, wherein the first side wall portion and the second side wall portion are respectively located at two end portions of each of the horizontal portion and the vertical portion.

5. The fixing frame according to claim 3, wherein the first connecting portion is located between the first side wall portion and the second side wall portion.

6. The fixing frame according to claim 1, further comprising a buffer structure, disposed on a bottom surface of the horizontal portion.

7. The fixing frame according to claim 1, wherein the location of the first free end above the vertical portion is selectable so that when the vertical portion is fixedly connected to a bottom portion of a side wall of the casing, the first free end is fixedly connected to a position of one-half to two-thirds of a height of the side wall.

8. The fixing frame according to claim 1, further comprising a reinforcement rib structure, disposed where the horizontal portion and the vertical portion are connected.

9. The fixing frame according to claim 1, further comprising a second connecting portion which is connected to the horizontal portion opposite to the vertical portion and has a second free end, the second free end being located above the vertical portion, the first free end and the second free end being at different heights.

\* \* \* \* \*